United States Patent
Lee

(10) Patent No.: US 7,151,392 B2
(45) Date of Patent: Dec. 19, 2006

(54) OUTPUT DRIVER CIRCUIT

(75) Inventor: Sang Hee Lee, Seoul (KR)

(73) Assignee: Hynix Semiconductor Inc., Gyunggi-do (KR)

(*) Notice: Subject to any disclaimer, the term of this patent is extended or adjusted under 35 U.S.C. 154(b) by 82 days.

(21) Appl. No.: 10/977,696

(22) Filed: Oct. 29, 2004

(65) Prior Publication Data

US 2005/0200379 A1 Sep. 15, 2005

(30) Foreign Application Priority Data

Mar. 12, 2004 (KR) .................. 10-2004-0016970

(51) Int. Cl.
*H03K 19/175* (2006.01)

(52) U.S. Cl. .................. 326/82; 326/87; 326/26

(58) Field of Classification Search ............. 326/26, 326/27, 30, 82–87
See application file for complete search history.

(56) References Cited

U.S. PATENT DOCUMENTS

| | | | |
|---|---|---|---|
| 5,898,321 A * | 4/1999 | Ilkbahar et al. ............... 326/87 |
| 6,452,428 B1 | 9/2002 | Mooney et al. ............. 327/108 |
| 6,657,469 B1 | 12/2003 | Li .............................. 327/170 |
| 6,710,617 B1 * | 3/2004 | Humphrey ................... 326/30 |
| 6,744,287 B1 | 6/2004 | Kennedy et al. ............ 327/108 |
| 6,970,015 B1 * | 11/2005 | Chan et al. .................... 326/82 |
| 2002/0043997 A1 * | 4/2002 | Stark et al. ................. 327/170 |
| 2002/0190762 A1 | 12/2002 | Mooney et al. ............. 327/108 |
| 2004/0239391 A1 * | 12/2004 | Culler ......................... 327/170 |
| 2006/0022713 A1 * | 2/2006 | Tokuhiro et al. ............. 326/87 |

* cited by examiner

*Primary Examiner*—Don Le
(74) *Attorney, Agent, or Firm*—Marshall Gerstein & Borun LLP

(57) ABSTRACT

The present invention relates to an output driver circuit for a semiconductor memory device, in particular, a memory device using a DDR II concept or a concept similar thereto, which can reduce a variation in the slew rate of an output driver thereof between maximum and minimum values, while satisfying requirements of characteristics associated with slew rate.

9 Claims, 5 Drawing Sheets

OUTPUT DRIVER CIRCUIT

BACKGROUND OF THE INVENTION

1. Field of the Invention

The present invention relates to an output driver circuit, and more particularly to an output driver circuit for outputting internal data from a chip in a dynamic random access memory (DRAM) memory device to the outside of the chip.

2. Description of the Related Art

Semiconductor devices use an output driver circuit to output internal data from a chip thereof to the outside of the chip through an output terminal, that is, an output pad.

Such an output driver circuit includes a push-pull driver. Important functions of such a push-pull driver are to adjust the driving strength thereof to a desired level, and to control the slew rate of an output signal.

"Driving strength" is a force for driving an output signal toward a particular voltage level (for example, level of supply voltage or ground voltage). When the driving strength is higher, the output signal has a voltage level more approximate to the particular voltage level. Such a driving strength may be a pull-up driving strength or a pull-down driving strength. The pull-up driving strength is a force for driving an output signal toward a high voltage level, for example, a supply voltage level, whereas the pull-down driving strength is a force for driving an output signal toward a low voltage level, for example, a ground voltage level. In order to control the voltage level of a signal outputted from an output driver to a desired level, it is necessary to adjust the driving strength of the output driver.

"Slew rate" means a variation rate of the voltage level of an output signal, so that it may be considered as a gradient of voltage to time. Such a slew rate may be a rising slew rate or a falling slew rate. The rising slew rate represents the gradient of an output voltage, the level of which is transited from a low level to a high level. On the other hand, the falling slew rate represents the gradient of an output voltage, the level of which is transited from a high level to a low level. At a higher slew rate, the gradient of the output voltage is sharper. In other words, the level of the output voltage is abruptly varied within a short time.

Where an output push-pull driver exhibits a high slew rate, large noise current is generated, even though there is an advantage in terms of data skew. On the other hand, a low slew rate causes an increase in the amount of data skew, even through there is a reduction in noise current. Accordingly, it is necessary to appropriately adjust the slew rate of such an output push-pull driver to a desired value. For instance, in association with double data rate (DDR) II synchronous DRAMs (SDRAMs), standard values of slew rates of output drivers have been established, and strictly managed.

DDR SDRAM was introduced as a substitute for SDRAM in accordance with a new standard scheme to overcome limitations of SDRAM caused by the continuously increased bus speed. Such a DDR SDRAM is approximately similar to a standard SDRAM in terms of operation. However, the DDR SDRAM performs transmission two times per cycle (at rising and falling edges of a clock signal) to achieve a double increase in bandwidth.

Meanwhile, such a DDR SDRAM technique advanced to development of a DDR II SDRAM. For an application thereof to such a DDR II SDRAM, output driver circuits additionally have an off-chip driver (OCD) function to perform an increase or decrease in output driving strength in a step-wise fashion so that adjustment of impedance is achieved in accordance with such output driving strength control. The purpose of such an OCD function for performing control of output driving strength in an output driver circuit is to achieve impedance matching of the output driver circuit to a data output (Dout) signal representing internal data of a memory device, to which the output driver circuit is applied. Hereinafter, this operation will be described in brief.

A pre-driver outputs a plurality of data signals, based on the internal data, that is, the Dout signal. Two of the data signals are applied to respective gates of pull-up-driving and pull-down-driving switch elements, which may be PMOS and NMOS transistors. Another two of the data signals are applied to an OCD pre-driver. In addition to the latter two data signals, the OCD pre-driver receives control signals generated from a control unit of the memory device in accordance with coding information of the internal data. Based on the received signals, the OCD pre-driver generates a plurality of up-driving control signals for control of up-driving impedance, and a plurality of down-driving control signals for control of down-driving impedance. The up-driving and down-driving control signals from the OCD pre-driver are inputted to a push-pull driver, which also receives the data signal from the pre-driver. Based on the received signals, the push-pull driver generates an output signal having a predetermined strength. In this case, the up-driving and down-driving control signals control ON/OFF of the pull-up-driving and pull-down-driving switch elements in the push-pull driver, thereby controlling the impedance of an output driver, that is, the push-pull driver.

However, such a conventional output driver circuit has a problem in that it is impossible to satisfy requirements of characteristics associated with slew rate due to the addition of the OCD function. That is, since the internal data outputted from the memory device via the level shifters is inputted to a new circuit arrangement, that is, the OCD pre-driver, in accordance with the DDR II technique, so that the internal data is processed in accordance with the function of the OCD pre-driver, an increase in current load occurs inevitably. In order to cope with the increased current load, the level shifters inevitably use PMOS and NMOS transistors having increased capacities and sizes. However, such increased capacities of the PMOS and NMOS transistors may cause an excessive increase or decrease in slew rate in the output driver. For this reason, there may be a problem in that it is impossible to satisfy upper and lower limits required for desired characteristics of products in association with slew rate. In particular, such a problem is more remarkable when an increase in slew rate occurs due to increased capacities of the PMOS transistors of the level shifters while exceeding the upper limit required for desired characteristics in association with slew rate.

The following Table 1 describes measured values of slew rate in the conventional output driver circuit. Referring to Table 1, it can be seen that the measured maximum values exceed 4.5 V/ns, which is an upper limit prescribed in association with slew rate in specifications prescribing requirements of characteristics. It can also be seen that, although the measured minimum values are not below 1.5 V/ns, which is a lower limit prescribed in association with slew rate in the specifications, it is approximate to the lower limit, so that the circuit exhibits very unstable operation characteristics.

TABLE 1

| Slew Rate | Minimum Value | Typical Value | Maximum Value |
|---|---|---|---|
| Up-Slew-Rate | 1.5 Vn/ns | 3.1 Vn/ns | 5.1 Vn/ns |
| Down-Slew-Rate | 1.65 Vn/ns | 3.1 Vn/ns | 5.7 Vn/ns |

SUMMARY OF THE INVENTION

Therefore, it is an object to provide an output driver circuit for a semiconductor memory device, in particular, a memory device using a DDR II concept or a concept similar thereto, which can reduce a variation in the slew rate of an output driver thereof between maximum and minimum values, while satisfying requirements of characteristics associated with slew rate.

In accordance with the present invention, this object is accomplished by providing an output driver circuit for outputting internal data of a memory device to the outside of the memory device, comprising: a pre-driver for generating a plurality of data signals, based on the internal data; an off-chip driver (OCD) pre-driver for receiving first and second ones of the data signals from the pre-driver and predetermined control signals from a control unit included in the memory device, thereby generating a plurality of up-driving control signals for control of up-driving impedance and a plurality of down-driving control signals for control of down-driving impedance; a push-pull driver for receiving third and fourth ones of the data signals from the pre-driver and the up-driving and down-driving control signals from the OCD pre-driver, thereby generating an output signal; and a slew rate control unit for controlling the internal data inputted the pre-driver to adjust a slew rate of the output signal.

The memory device may be a double data rate (DDR) II synchronous dynamic random access memory (SDRAM) (DDR II SDRAM).

The push-pull driver may comprise: a plurality of pull-up elements for driving a voltage level of the output signal to a first output voltage level, based on the third data signal, the pull-up elements being individually and selectively driven, based on the up-driving control signals, respectively; and a plurality of pull-down elements for driving the voltage level of the output signal to a second output voltage level, based on the fourth data signal, the pull-down elements being individually and selectively driven, based on the down-driving control signals, respectively.

The memory device may be a DDR II SDRAM.

The slew rate control unit may be a resistor device.

The resistor device has a resistance of 300 to 400Ω.

The resistor device may be a plate type resistor device made of a material having a surface resistivity of 50 to 150 Ω/μm².

The resistor device may comprise an active resistor or a gate resistor.

The resistor device may comprise resistance components on bit lines of the memory device.

The output driver circuit having the above configuration operates as follows.

A data output (Dout) signal, which is internal data of the memory device, is inputted to the slew rate control unit after being driven to a predetermined voltage level by level shifters. The Dout signal is dropped in voltage level by the slew rate control unit, and is then applied to the pre-driver. Based on the Dout signal received from the slew rate control unit, the pre-driver outputs a plurality of data signals. Two of the data signals are inputted to the gates of pull-up driving elements included in the push-pull driver and the gates of pull-down driving elements included in the push-pull driver, respectively. Another two of the data signals are supplied to the OCD pre-driver. In addition to the latter two data signals, the OCD pre-driver receives control signals generated from a control unit of the memory device in accordance with coding information of the internal data. Based on the received signals, the OCD pre-driver generates a plurality of up-driving control signals for control of up-driving impedance, and a plurality of down-driving control signals for control of down-driving impedance. The push-pull driver receives the up-driving and down-driving control signals from the OCD pre-driver, along with the data signal from the pre-driver. Based on the received signals, the push-pull driver generates an output signal having a predetermined strength. The slew rate control unit is adapted to dull or control a gradient of the Dout signal. The slew rate control unit may be implemented, using passive or active resistor elements or a separate control circuit adapted to dull a gradient of an output signal. The slew rate control unit prevents an abrupt variation in the gradient of the output signal, and thus, an increased variation in slew rate, caused by increased capacities of PMOS and NMOS transistors included in the level shifters adapted to supply the internal data after performing a voltage level transition for the internal data. Accordingly, the slew rate control unit prevents the slew rate of the output signal from varying beyond a desired range meeting requirements of characteristics in products.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENTS

The present invention will now be described in detail with reference to various embodiments thereof, which are made only for illustrative purposes. The present invention is not to be construed as being limited to those embodiments.

Figure 1:
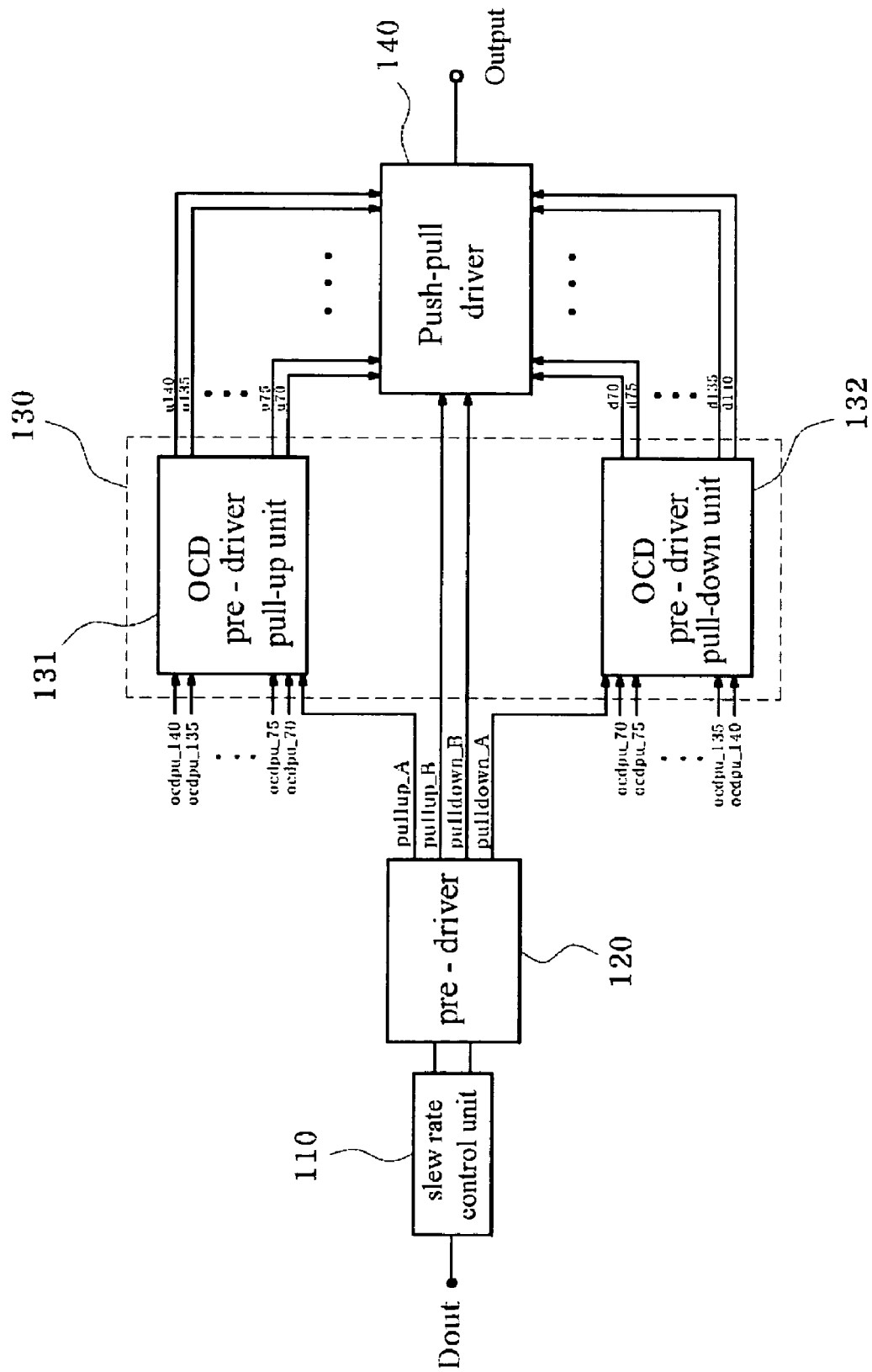
FIG. 1 is a block diagram illustrating an output driver circuit according to an embodiment of the present invention.

FIG. 1 illustrates an output driver circuit according to an embodiment of the present invention. Hereinafter, the output driver circuit will be described in detail with reference to FIG. 1.

As shown in FIG. 1, the output driver circuit according to the embodiment of the present invention includes a slew rate control unit 110 for receiving a data output (Dout) signal, which is internal data of a memory device, to which the output driver circuit is applied, and driven to a predetermined voltage level by level shifters (not shown), and outputting the received Dout signal, a pre-driver 120 for outputting data signals pullup_A, pulldown_A, pullup_B, and pulldown_B in response to the Dout signal outputted from the slew rate control unit 110, and an OCD pre-driver 130 for receiving the signals pullup_A and pulldown_A from the pre-driver 120 while receiving control signals ocdpu_70, ocdpu_75, . . . , ocdpu_135, ocdpu_140, ocdpd_70, ocdpd_75, . . . , ocdpd_135, and ocdpd_140 from a control unit (not shown) included in the memory device, thereby generating a plurality of down-driving control signals u70, u75, . . . , u135, and u140 for control of up-driving impedance, and a plurality of down-driving control signals d70, d75, . . . , d135, and d140 for control of down-driving impedance. The output driver circuit also includes a push-pull driver 140 for receiving the control signals pullup_B, and pulldown_B from the pre-driver 120, and the up-driving control signals and down-driving control signals from the OCD pre-driver 130, thereby generating an output signal.

The OCD pre-driver 130 includes an OCD pre-driver pull-up unit 131 for outputting the up-driving control signals, and an OCD pre-driver pull-down unit 132 for outputting the down-driving control signals.

Now, operation of the output driver circuit having the above-described configuration according to the embodiment of the present invention will be described.

Figure 2:
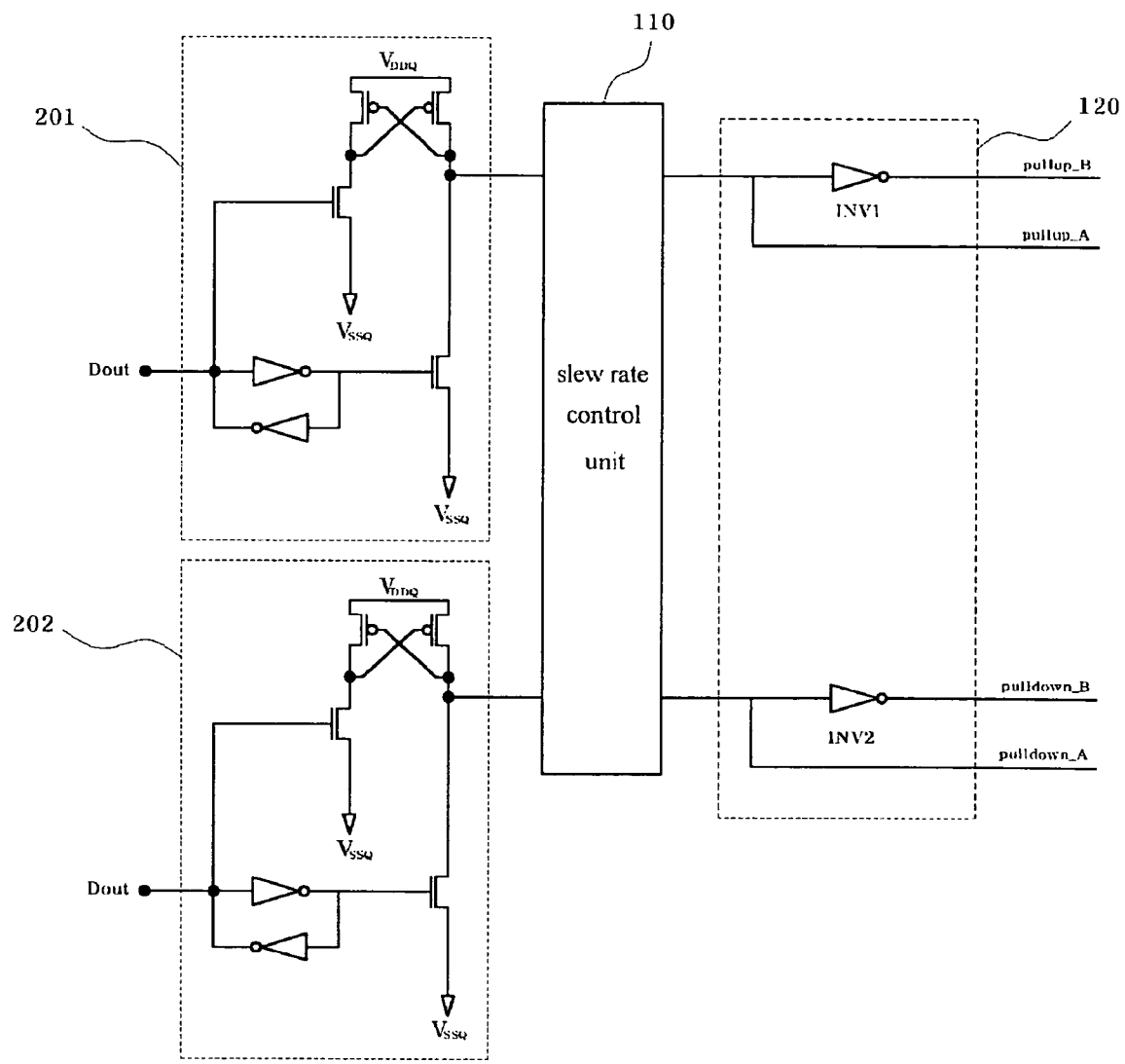
FIG. 2 is a circuit diagram for explaining operations of a slew rate control unit and a pre-driver, which are included in the output driver circuit.
Figure 3:
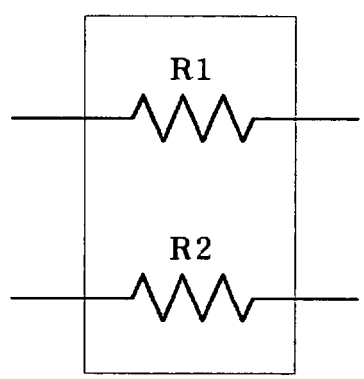
FIG. 3 is a circuit diagram illustrating a circuit configuration of the slew rate control unit.

As shown in FIG. 2, a Dout signal, which is internal data driven from a voltage level VDD to a voltage level VDDQ by level shifters 201 and 202, is first inputted to the slew rate control unit 110. The slew rate control unit 110 is adapted to dull or control a gradient of the Dout signal. The slew rate control unit 110 may be implemented, using a resistor circuit or a separate control circuit adapted to dull a gradient of an output signal. In particular, the slew rate control unit 110 may be composed of resistors R1 and R2 having a resistance of 300 to 400Ω. In this case, passive resistors, active resistors, gate resistors, etc. may be used for the resistors R1 and R2. The used resistors may be implemented in the form of a plate type resistor, using a material having a surface resistivity of 50 to 150 $\Omega/\mu m^2$, in order to reduce the area of the resistors occupied in the semiconductor memory device while satisfying the above-described required resistance. Alternatively, the resistors may be implemented, using resistance components on bit lines of the associated DRAM. The resistances of the resistors R1 and R2 may be independently determined, depending on the environment of a system, to which the output drive circuit is applied.

In particular, where the semiconductor memory device, to which the output driver circuit is applied, is a DDR II SDRAM, the slew rate control unit 110 prevents a considerable increase or decrease in voltage increase rate, that is, slew rate, caused by increased capacities of PMOS and NMOS transistors included in the level shifters 201 and 202. That is, the slew rate control unit 110, which is composed of resistors, is arranged between the level shifters 201 and 202 and the pre-driver 120, to add impedance components. In accordance with such an addition of impedance components, it is possible to prevent the slew rate of the output signal from being susceptible to an increase in the capacity of each resistor, and thus, to prevent the slew rate of the output signal from varying beyond a desired range. Such an effect is more remarkable in preventing the problem encountered in DDR II products, that is, an increase in slew rate exceeding an upper limit thereof.

Since the output driver circuit according to the embodiment of the present invention employs the slew rate control unit 110 as described above, it sufficiently satisfies requirements of characteristics prescribed in specifications in association with upper and lower slew rate limits. Accordingly, it is possible to prevent an excessive increase in data skew and noise current.

Thereafter, the Dout signal outputted from the slew rate control unit 110 is applied to the pre-driver 120, which in turn performs inversion or non-inversion processing for the Dout signal, thereby outputting data signals pullup_A, pulldown_A, pullup_B, and pulldown_B.

Figure 6:
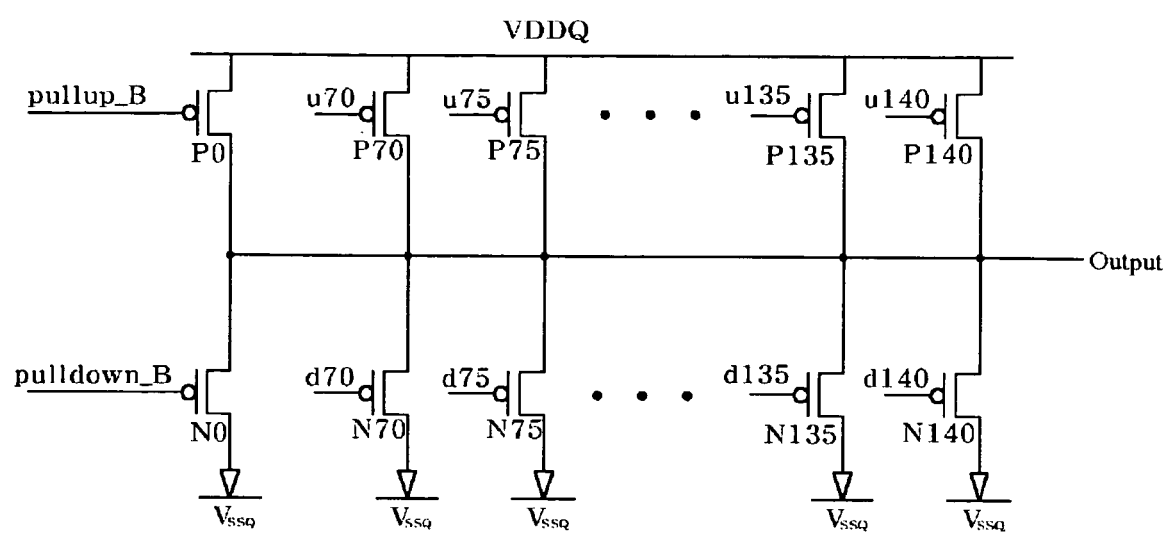
FIG. 6 is a circuit diagram illustrating a push-pull driver included in the output driver circuit.

As shown in FIG. 6, the data signals pullup_B and pulldown_B are applied to PMOS and NMOS transistors P0 and N0 included in the push-pull driver 140, as control signals to pull up and pull down an output signal, respectively.

Figure 4:
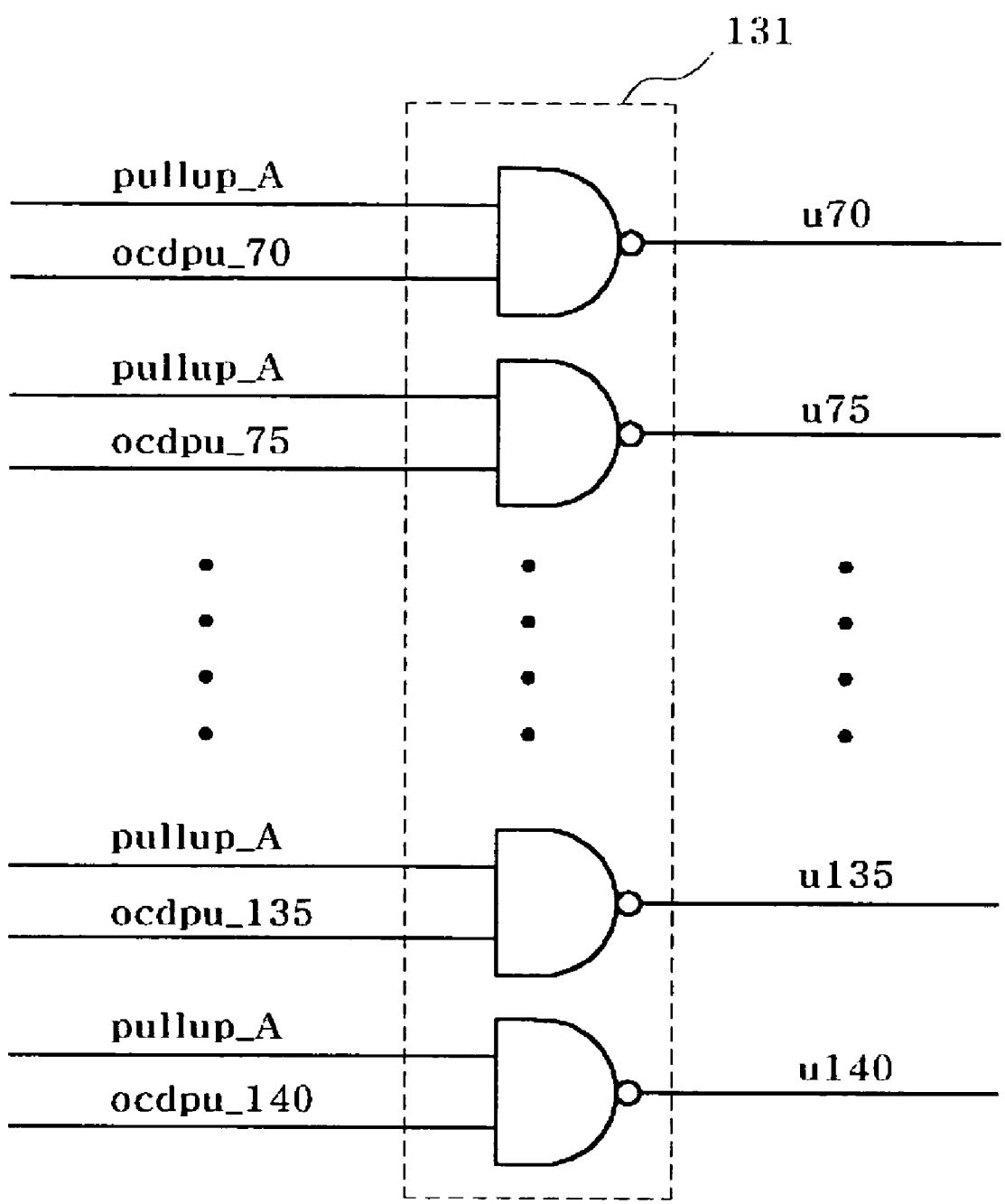
FIG. 4 is a circuit diagram illustrating a circuit configuration of an OCD pre-driver pull-up unit included in the output driver circuit.

The data signal pullup_A is inputted, as a control signal, to logic elements composing the OCD pre-driver pull-up unit 131 of the OCD pre-driver 130. As shown in FIG. 4, the OCD pre-driver pull-up unit 131 not only receives the control signal pullup_A at first inputs of NAND gates thereof, but also receives, at respective second inputs of the NAND gates, control signals ocdpu_70, ocdpu_75, . . . , ocdpu_135, and ocdpu_140 from a control unit (not shown) included in the memory device. The OCD pre-driver pull-up unit 131 performs a logic operation for the received control signals, thereby generating up-driving control signals u70, u75, . . . , u135, and u140 for control of up-driving impedance, which is in turn sent to the push-pull driver 140.

Figure 5:
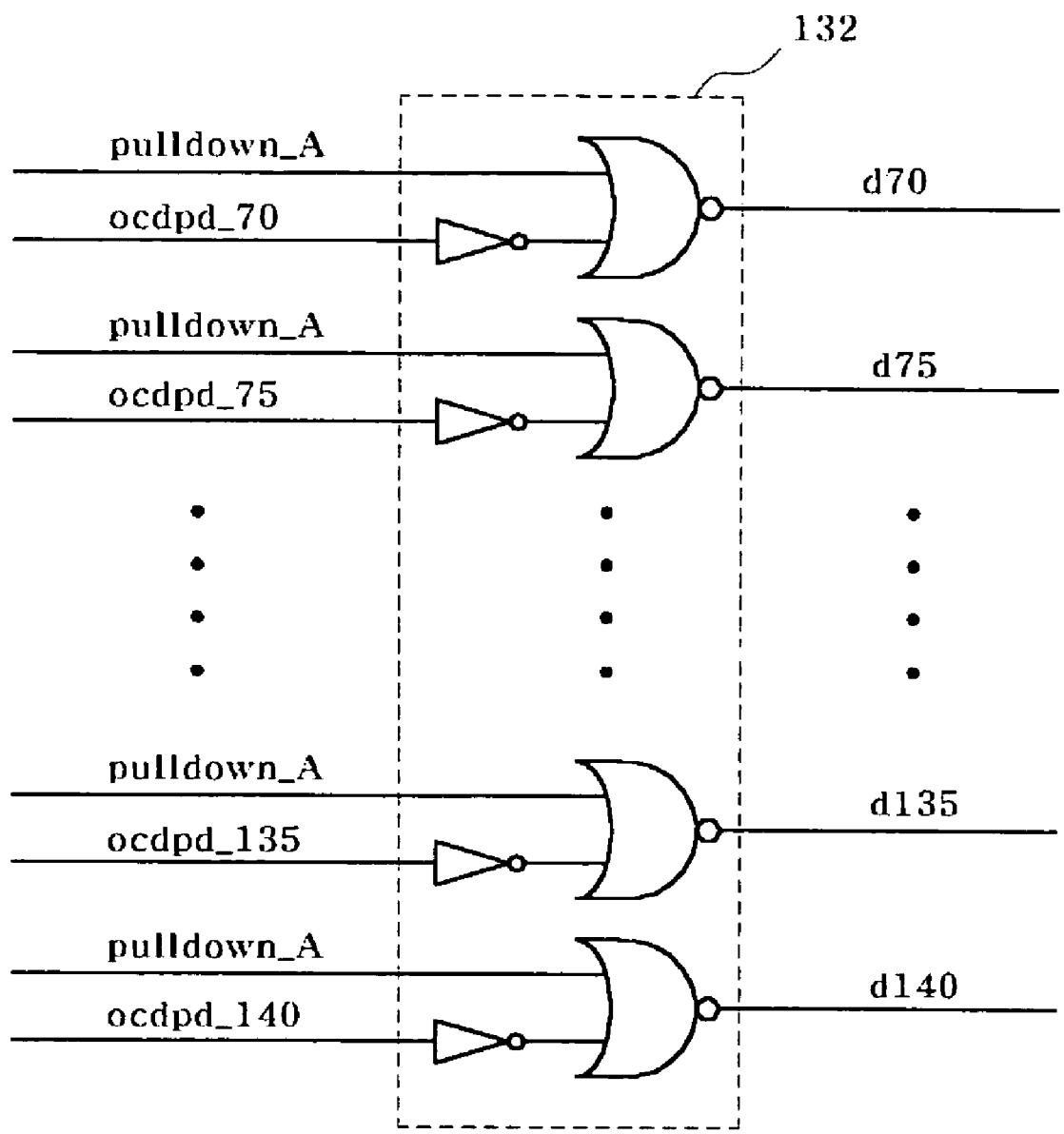
FIG. 5 is a circuit diagram illustrating a circuit configuration of an OCD pre-driver pull-down unit included in the output driver circuit.

The data signal pulldown_A is also inputted, as a control signal, to logic elements composing the OCD pre-driver pull-down unit 132 of the OCD pre-driver 130. As shown in FIG. 5, the OCD pre-driver pull-down unit 132 not only receives the control signal pulldown_A at first inputs of NOR gates thereof, but also receives, at respective second inputs of the NOR gates, control signals ocdpd_70, ocdpd_75, . . . , ocdpd_135, and ocdpd_140 from the control unit (not shown) included in the memory device. The OCD pre-driver pull-down unit 132 performs a logic operation for the received control signals, thereby generating down-driving control signals d70, d75, . . . , d135, and d140 for control of down-driving impedance, which is in turn sent to the push-pull driver 140.

The push-pull driver 140, which includes a plurality of pull-up-driving PMOS transistors P0, P70, P75, . . . , P135, and P140, and a plurality of pull-down-driving NMOS transistors N0, N70, N75, . . . , N135, and N140, receives the control signals pullup_B and pulldown_B from the pre-driver 120, while receiving the up-driving control signals and down-driving control signals from the OCD pre-driver 130. Based on the received signals, the push-pull driver 140, which is an output driver, generates an output signal.

Now, the principle of adjusting the impedance of the output driver in accordance with the embodiment of the present invention will be described.

When the internal data of the memory device, that is, the Dout signal, has a high level, the signals pullup_B and pulldown_B, which are outputted from respective inverters INV1 and INV2 of the pre-driver 120, have a low level, so that they turn on the PMOS transistor P0 of the push-pull driver 140 while turning off the NMOS transistor N0 of the push-pull driver 140, respectively. As a result, a high-level signal is outputted from an output terminal of the push-pull driver 140. In this case, the control signals ocdpu_70 to ocdpu_100 and ocdpd_70 to ocdpd_100 outputted from the control unit (not shown) included in the memory device are basically set to have a high level, whereas the control signals ocdpu_105 to ocdpu_140 and ocdpd_105 to ocdpd_140 outputted from the control unit are basically set to have a low level.

Accordingly, where the internal data, that is, the Dout signal, has a high level, the control signals u70 to u100 outputted from the NAND gates of FIG. 4, to which the signals ocdpu_70 to ocdpu_100 are inputted in a high-level state, have a low level because the signal pullup_A has a high level, so that they turn on the PMOS transistors P70 to P100 of the push-pull driver 140 shown in FIG. 6, respectively. On the other hand, the control signals u105 to u140 outputted from the NAND gates of FIG. 4, to which the signals ocdpu_105 to ocdpu_140 are inputted in a low-level state, have a high level, so that they turn off the PMOS transistors P105 to P140 of the push-pull driver 140 shown in FIG. 6, respectively. In this case, the NOR gates of the OCD pre-driver pull-down unit 132 receive the high-level signal pulldown_A at respective first inputs thereof, so that the control signals d70 to d140 outputted from respective NOR gates have a low level. As a result, the NMOS transistors N70 to N140 of the push-pull driver 140 are turned off. Thus, only the PMOS transistors P70 to P100, which are pull-up driving elements of the push-pull driver 140, are turned on to pull up an output signal at the output terminal of the output driver circuit.

In this case, where it is necessary to adjust the impedance of the output driver, this adjustment can be achieved by selectively adjusting respective voltage levels of the control signals ocdpd_70, ocdpd_75, . . . , ocdpd_135, and ocdpd_140 to a high or low level, thereby selectively adjusting respective pull-up-driving control signals of the associated PMOS transistors of the push-pull driver 140 to a high or low level, that is, adjusting the number of the selectively-turned-on PMOS transistors.

Where the internal data, that is, the Dout signal, has a low level, the impedance adjustment of the output driver is achieved by adjusting the number of the selectively-turned-on NMOS transistors of the push-pull driver 140 in accordance with an operation similar to that of the above described case.

As described above, the slew rate control unit 110 in this embodiment prevents a considerable increase or decrease in slew rate caused by increased capacities of the PMOS and NMOS transistors included in the level shifters 201 and 202, in particular, in the case in which the output driver circuit of this embodiment is applied to a DDR II SDRAM. That is, the slew rate control unit 110 is arranged between the level shifters 201 and 202 and the pre-driver 120, to add impedance components. In accordance with the addition of impedance components, it is possible to prevent the slew rate of the output signal from being susceptible to an increase in the capacity of each resistor while reducing such a variation in slew rate between maximum and minimum values, thereby preventing the slew rate of the output signal from varying beyond a desired range.

As apparent from the above description, in the output driver circuit according to the present invention, the slew rate control unit is arranged at an upstream node of the pre-driver to control the slew rate of the output signal to meet requirements associated with upper and lower slew rate limits. Accordingly, it is possible to prevent an excessive increase in data skew and noise current. Thus, the present invention makes it possible to produce semiconductor memory devices having a sufficient competitiveness.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An output driver circuit for outputting internal data of a memory device to the outside of the memory device, comprising:
   a pre-driver for generating a plurality of data signals, based on the internal data;
   an off-chip driver (OCD) pre-driver for receiving first and second ones of the data signals from the pre-driver and predetermined control signals from a control unit included in the memory device, thereby generating a plurality of up-driving control signals for control of up-driving impedance and a plurality of down-driving control signals for control of down-driving impedance;
   a push-pull driver for receiving third and fourth ones of the data signals from the pre-driver and the up-driving and down-driving control signals from the OCD pre-driver, thereby generating an output signal; and
   a slew rate control unit for controlling the internal data inputted the pre-driver to adjust a slew rate of the output signal.

2. The output driver circuit according to claim 1, wherein the memory device is a double data rate (DDR) II synchronous dynamic random access memory (SDRAM) (DDR II SDRAM).

3. The output driver circuit according to claim 1, wherein the push-pull driver comprises:
   a plurality of pull-up elements for driving a voltage level of the output signal to a first output voltage level, based on the third data signal, the pull-up elements being individually and selectively driven, based on the up-driving control signals, respectively; and
   a plurality of pull-down elements for driving the voltage level of the output signal to a second output voltage level, based on the fourth data signal, the pull-down elements being individually and selectively driven, based on the down-driving control signals, respectively.

4. The output driver circuit according to claim 3, wherein the memory device is a DDR II SDRAM.

5. The output driver circuit according to claim 1, wherein the slew rate control unit is a resistor device.

6. The output driver circuit according to claim 5, wherein the resistor device has a resistance of 300 to 400Ω.

7. The output driver circuit according to claim 5, wherein the resistor device is a plate type resistor device made of a material having a surface resistivity of 50 to 150 $\Omega/\mu m^2$.

8. The output driver circuit according to claim 5, wherein the resistor device comprises an active resistor or a gate resistor.

9. The output driver circuit according to claim 5, wherein the resistor device comprises resistance components on bit lines of the memory device.

\* \* \* \* \*